United States Patent
Engel et al.

(10) Patent No.: US 9,954,976 B2
(45) Date of Patent: Apr. 24, 2018

(54) SYSTEM AND METHOD FOR REMOTELY DISPLAYING DATA

(75) Inventors: Glenn Engel, Snohomish, WA (US); Glen L. Purdy, Jr., Snohomish, WA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 1350 days.

(21) Appl. No.: 12/263,544

(22) Filed: Nov. 3, 2008

(65) Prior Publication Data
US 2010/0115437 A1    May 6, 2010

(51) Int. Cl.
*G06F 3/00* (2006.01)
*H04L 29/08* (2006.01)

(52) U.S. Cl.
CPC .......... *H04L 67/36* (2013.01); *H04L 67/025* (2013.01); *H04L 67/12* (2013.01)

(58) Field of Classification Search
CPC .............................. G06F 3/1454; G06F 9/4445
USPC ................................................ 715/746, 740
See application file for complete search history.

(56) References Cited

U.S. PATENT DOCUMENTS

| | | | | |
|---|---|---|---|---|
| 6,020,881 A * | 2/2000 | Naughton | ............... | H04L 29/06 348/E5.102 |
| 6,920,557 B2 * | 7/2005 | Coffy | ................. | G06Q 20/3674 380/261 |
| 7,111,242 B1 * | 9/2006 | Grooters | ................... | G06F 8/38 715/716 |
| 7,224,262 B2 * | 5/2007 | Simon | ..................... | B60R 25/04 340/426.13 |
| 7,340,682 B2 * | 3/2008 | Nason et al. | .................. | 715/746 |
| 7,363,587 B2 * | 4/2008 | Schaeffer et al. | ............. | 715/740 |
| 7,444,188 B2 * | 10/2008 | De Meyer | .............. | G08C 19/28 340/3.1 |
| 2002/0126151 A1 * | 9/2002 | Chandhoke et al. | ......... | 345/771 |
| 2002/0165954 A1 * | 11/2002 | Eshghi et al. | ................ | 709/224 |
| 2003/0058243 A1 * | 3/2003 | Faust | .................... | G06T 11/206 345/440 |
| 2003/0083838 A1 * | 5/2003 | Barrett et al. | ................ | 702/117 |
| 2004/0095381 A1 * | 5/2004 | McDowell | .................... | 345/740 |
| 2004/0239309 A1 * | 12/2004 | Barr et al. | ................ | 324/121 R |
| 2005/0216219 A1 * | 9/2005 | De La Quintana | ........... | 702/119 |
| 2005/0278129 A1 * | 12/2005 | Benvenga et al. | .............. | 702/68 |

* cited by examiner

*Primary Examiner* — Sara England
(74) *Attorney, Agent, or Firm* — Mannava & Kang, P.C.

(57) ABSTRACT

An electronic device for collecting and displaying measurement data includes a data interface, a processor and a transport interface. The data interface obtains measurement data. The processor is configured to generate portable graphical user interface (GUI) information indicating a visual format corresponding to at least one of the measurement data or the electronic device, and to associate the portable GUI information with the measurement data. The transport interface is configured to deliver the measurement data and the associated portable GUI information to a remote display, enabling the remote display to display the measurement data in accordance with the visual format indicated by the portable GUI information.

20 Claims, 4 Drawing Sheets

SYSTEM AND METHOD FOR REMOTELY DISPLAYING DATA

BACKGROUND AND SUMMARY

Different types of electronic instruments are used to perform various measurements and data collection, including oscilloscopes, spectrum analyzers, network analyzers, chemical analyzers and voltmeters, for example. Due to the distinct nature of the data collected and processed by these instruments, each type has a specific visual interface for displaying measurement or analytic results. The visual interface may be as simple as a numeric readout for a voltmeter to as complex as spectrum traces for a spectrum analyzer.

Test systems may receive data from measurement instruments in order to store, assemble, process and/or display the data. For example, raw data may be retrieved over a data network and displayed at a remote work station, such as a personal computer (PC) or laptop. When test systems receive and display the data, they may attempt to mimic the visual interface corresponding to the type of instrument used to collect the data, in order to assist in understanding and analysis of the data. However, such displays typically are not as rich or complete as the visual interface on the instruments themselves, and sometimes provide only static pages, when a web interface is available. Alternatively, the test systems may attempt to insert images of the display using a digital image format, such as bitmap format, which is cumbersome, requires transporting large amounts of data for one image, and cannot be seamlessly updated (e.g., requires "refresh" operations).

In one aspect of the invention, an electronic device for collecting and displaying measurement data includes a data interface for obtaining measurement data, a processor, and a transport interface. The processor is configured to generate portable graphical user interface (GUI) information indicating a visual format corresponding to at least one of the measurement data or the electronic device, and to associate the portable GUI information with the measurement data. The portable GUI information includes a GUI rendering engine and corresponding metadata for configuring the GUI rendering engine. The transport interface is configured to deliver the measurement data and the associated portable GUI information to a remote display, enabling the remote display to display the measurement data in accordance with the visual format indicated by the portable GUI information.

In another aspect of the invention, an electronic device for enabling remote display of measurement data includes a network interface and a web server. The network interface is configured to receive measurement data over a data network, the measurement data originating at an electronic instrument having a corresponding visual display format for displaying the measurement data. The web server is configured to populate a web page with the measurement data and associated GUI information in response to a request from a web client over the data network. The GUI information includes a GUI rendering engine for indicating the visual display format in which the measurement data is to be displayed. The populated web page is transported to the web client over the data network, enabling the web client to display the measurement data in the visual format.

In yet another aspect of the invention, a method of remotely displaying data is provided. The method includes generating measurement data, generating portable GUI information in relation to the measurement data, and storing the portable GUI information in relation to the associated measurement data. The portable GUI information indicates a visual format of the measurement data corresponding to a visual display having predetermined parameters. A web page is populated with the measurement data and the associated GUI information in response to a request from a web client over a data network. The populated web page is transported to the web client over the data network for display, enabling the web client to display the measurement data in the visual format, including the predetermined parameters.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known devices and methods may be omitted so as to not obscure the description of the example embodiments. Such methods and devices are clearly within the scope of the present teachings.

In the various embodiments, an electronic instrument collects and stores data, such as measurement data or other electronic data. The data is associated with a display format specific to the type of instrument and/or the data. The display format may enable the data to be displayed on a local display of the instrument, according to the display format, when the instrument has a local display. In addition, the data is associated with portable graphical user interface (GUI) information, which describes the specific display format. The data may be accessed by a remote display device, such as a PC or laptop computer, along with the associated portable GUI information, so that the remote display device is able to display the data in a visual format substantially the same as the format specific to the instrument. For example, the remote display device may be a web client, which accesses the data and associated portable GUI information over a display network, via a web server, using an ordinary web browser. Alternatively, the remote display device may include a portable memory interface, such as a universal serial bus (USB) interface, enabling the remote display device to retrieve the data and associated portable GUI information from a USB storage device. Accordingly, the data may be presented at the remote display device in a domain specific manner without the client having prior knowledge of the specific domain.

Figure 1:
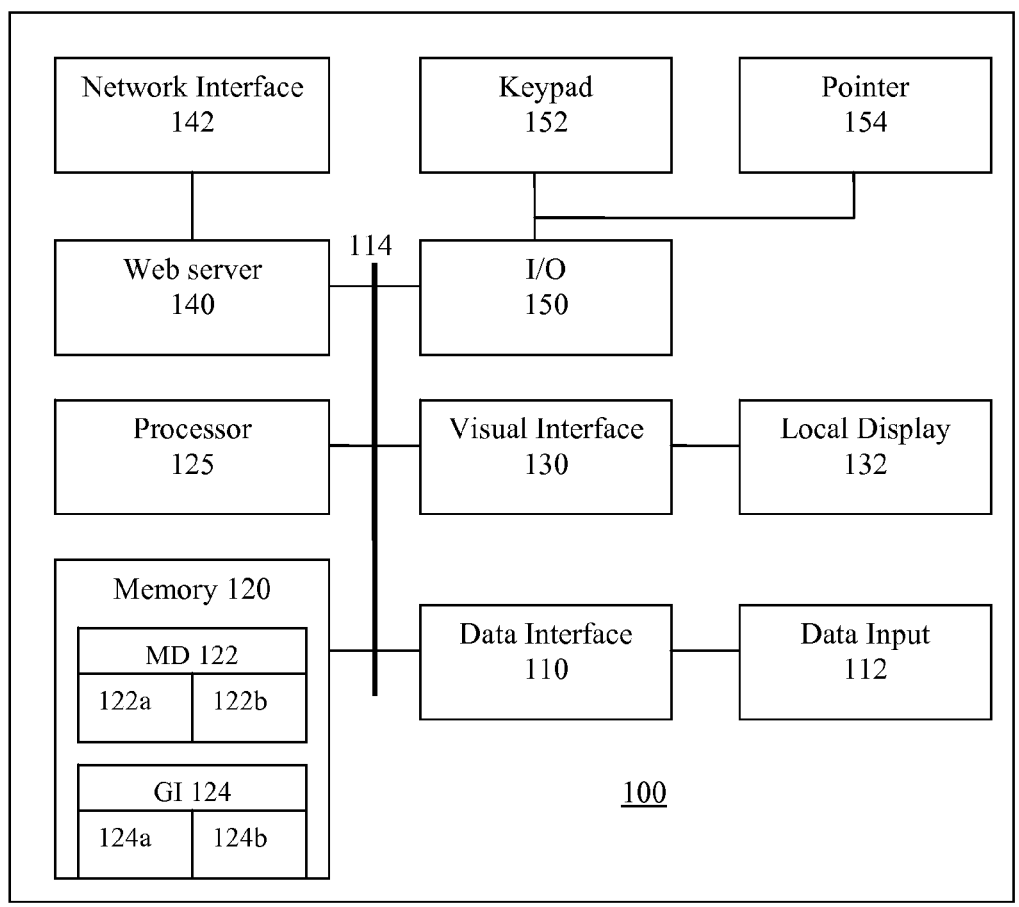
FIG. 1 is a functional block diagram illustrating an electronic instrument, according to a representative embodiment.

FIG. 1 is a block diagram illustrating an electronic instrument 100, according to a representative embodiment. The instrument 100 may be any type of instrument for collecting, measuring, processing and/or analyzing various types of information. Examples of the instrument 100 include oscilloscopes, spectrum analyzers, network analyzers, chemical analyzers, volt-ohm meters, and the like. In alternative embodiments, the instrument 100 may include any type of electronic device that collects, generates and/or displays data in a format specific to the subject instrument and/or to the type of data.

As will be appreciated by those skilled in the art, one or more of the various "parts" shown in FIG. 1 may be physically implemented using a software-controlled microprocessor, hard-wired logic circuits, or a combination thereof. Also, while the parts are functionally segregated in FIG. 1 for explanation purposes, they may be combined variously in any physical implementation.

In the depicted representative embodiment, the instrument 100 includes a data input 112 and a corresponding data interface 110 for receiving and initially processing raw data (122a). The data input 112 may be any type of input for receiving electronic data. For example, if the instrument 100 is an oscilloscope or spectrum analyzer, the data input 112 may include multiple channel inputs for receiving signals from a device under test, and the data interface 110 may be configured to acquire and condition the incoming signals, and to convert the conditioned signals from analog to digital.

Memory 120 may be any number, type and combination of nonvolatile read only memory (ROM) and volatile random access memory (RAM), and may provide look-up tables and/or other relational functionality. In various embodiments, the memory 120 may be a disk drive, for example. Further, the memory 120 may store program instructions and results of calculations or summaries performed by processor 125, for example. As shown in FIG. 1, the memory 120 stores measurement data 122, which includes the raw data 122a and corresponding metadata 122b describing the raw data 122a. The raw data 122a may be formatted in accordance with various transport standards, such as Extensible Markup Language (XML), wireless access protocol binary XML (WBXML), JavaScript Object Notation (JSON), and the like, to accommodate communications over a data network, such as network 210 discussed below with respect to FIG. 2. The metadata 122b provides additional information corresponding to the raw data to facilitate proper understanding and interpretation of the raw data, including, for example, acquisition rates, instrument and display settings, such as vertical and horizontal axis calibration, marker placement, value ranges, time stamps, and the like. The metadata may be generated by processor 125, for example.

In addition to being stored, the measurement data 122 may be accessible, e.g., through a buffer (not shown), in real-time or near real-time for visual display on a local display 132 via visual interface 130 and/or for access by the web server 140. It understood that, in alternative embodiments, the instrument 100 does not include a local display, although the measurement data 122 would still have an associated visual display format, for example, based on the type of instrument and/or the type of measurement data 122.

The memory 120 also stores portable GUI element or portable GUI information 124, in association with the stored measurement data 122. The portable GUI information 124 effectively is additional metadata that indicates the manner in which the associated measurement data 122 would be rendered and displayed, for example, on the local display 132. In other words, each entry in memory 120 of measurement data 122 is effectively linked to a corresponding entry of portable GUI information 124. The portable GUI information 124 may be generated by the processor 125, for example, it identifies the associated measurement data 122 and provides customized display features corresponding to display parameters of the local display 132, thus indicating the manner in which the data is to be displayed. For example, the portable GUI information may indicate whether the associated raw data 122a is to be displayed in the form of a number, a trace, a histogram, a pie-chart, or the like. The parameters of the customized display, e.g., center point, scale and mark spacing of a trace, may be determined from the metadata 122b corresponding to the raw data 122a.

More particularly, the portable GUI information 124 includes a portable GUI rendering engine 124a and corresponding metadata 124b for configuring the GUI rendering engine 124a. The GUI rendering engine 124a may be implemented as an applet, for example, downloadable by a web browser (e.g., in client software 223 of FIG. 2) or other remote display device. An application programming interface (API) between the applet and the application of processor 125 enables access to the measurement data 122. In an illustrative embodiment, the applet may be provided in Flash, for example, available from Adobe Systems, Inc. The configuration metadata 124b provides information regarding the GUI rendering engine 124a, as well as information on how to obtain the raw data 122a and/or hints on how to display the raw data 122a. The configuration metadata 124b may be a uniform resource locator (URL) on the instrument 100, for example.

The GUI rendering engine 124a and configuration metadata 124b are portable in that they may be transported outside the instrument 100. For example, as shown in the depicted illustrative embodiment, the GUI rendering engine 124a and configuration metadata 124b may be transported over a network (e.g., network 210) to a web server (e.g., web server 230) and retrieved, along with the corresponding measurement data 122, for example, by a web client (e.g., web client 220) using an ordinary a web browser, as discussed below. In alternative embodiments, the GUI rendering engine 124a and configuration metadata 124b may be stored along with the corresponding measurement data 122 in an external portable memory, such as a removable USB flash drive or memory stick, via a memory interface (not shown), such as a USB interface. The portable GUI information 124 and corresponding measurement data 122 may then be subsequently uploaded by a remote display device having a compatible portable memory interface. Accordingly, the portable GUI information 124 is not confined to the instrument 100, but may travel (e.g., with the measurement data 122) and be independently managed.

The portable GUI information 124 may likewise be formatted in accordance with various transport standards, such as XML, WBXML, JSON, and the like, to accommodate communications over a data network, discussed below with respect to FIG. 2. In an embodiment, the portable GUI information may be included with the metadata 122b of the measurement data 122. Also, like the measurement data 122, the portable GUI information 124 may be accessible, e.g., through a buffer (not shown), in real-time or near real-time for access by the web server 140, discussed below.

The processor 125 is configured to execute one or more software algorithms, including the portable GUI display process of the embodiments described herein, in conjunction with the memory 120, as well as the basic functionality of the instrument 100. The processor 125 may include its own memory (e.g., nonvolatile memory) for storing executable software code that allows it to perform the various functions of the instrument 100. Alternatively, the executable code may be stored in designated memory locations within memory 120. The processor 125 executes an operating system, such as Windows operating systems available from Microsoft Corporation, NetWare operating system available from Novell, Inc., or Unix operating system available from Sun Microsystems, Inc. The operating system controls execution of other programs, including data collection via data interface 110, data processing and visual display via visual interface 130, as well as other user and/or device interfaces, such as keypad 152 and/or mouse 154, via I/O 150.

The local display 132 may be any type of visual display used for showing the raw data 122a, the measurement data 122 and/or corresponding processing results. Depending on the type of instrument and information to be displayed, the local display 132 may be a liquid crystal display (LCD) or a cathode ray tube (CRT) display, for example, although it is understood that any type of display may be incorporated. The information is displayed on the local display 132 in a visual format corresponding to the type of instrument 100, which has been designed to assist the user in easily understanding the meaning of the data. For example, the local display 132 of a voltmeter may be an LCD screen showing numerical digits indicating measured voltage and units, while the local display 132 of an oscilloscope may be a CRT display showing real time signal traces, together with summary information shown in peripheral tables or graphs. The parameters of the visual format are implemented through the visual interface 130.

In the illustrative embodiment shown in FIG. 1, the instrument 100 also includes a transport interface, which including web server 140 and network interface 142, for example. The web server 140 is configured to interface with a communications network, such as network 210 of FIG. 2, through the network interface 142. The communications network may be any network capable of transporting electronic data, such as the Internet, a local area network (LAN), a wireless LAN, and the like. The network interface 142 may include, for example, a transceiver (not shown), including a receiver and a transmitter, that provides functionality for the instrument 100 to communicate wirelessly over the data network through an antenna system (not shown), according to appropriate standard protocols. However, it is understood that the network interface 142 may include any type of interface (wired or wireless) with the communications network, including various types of digital modems, for example. The web sever 140 executes web server software, such as Apache available from the Apache Software Foundation, web server software intended for embedded use, or customized web server software. In various embodiments, the web server 140 may be incorporated in functionality of the processor 125. The web server 140 is accessible to various clients over the network.

It is understood that alternative embodiments may include any type of transport interface capable of interfacing with communication or storage mediums, enabling transport of the measurement data 122 and associated portable GUI information 124 from the instrument 100 to a remote display device, without departing from the spirit and scope of the disclosure. For example, as discussed above, the transport interface may be a USB or other portable memory interface, which enables the measurement data 122 and associated portable GUI information 124 to be stored, transported and then uploaded to the remote display device having the same type of portable memory interface. As another example, the transport interface may be a standard commands for programmable instrumentation (SCPI) interface, and the remote display device may be a controller (e.g., a PC or laptop computer) in a test system, which enables the measurement data 122 and associated portable GUI information 124 to be sent to the remote display device, e.g., via a local testing network. As discussed above, the GUI rendering engine 124a may be implemented as an applet executable by the controller, and an API between the applet and the application of processor 125 enables access to the measurement data 122.

Figure 2:
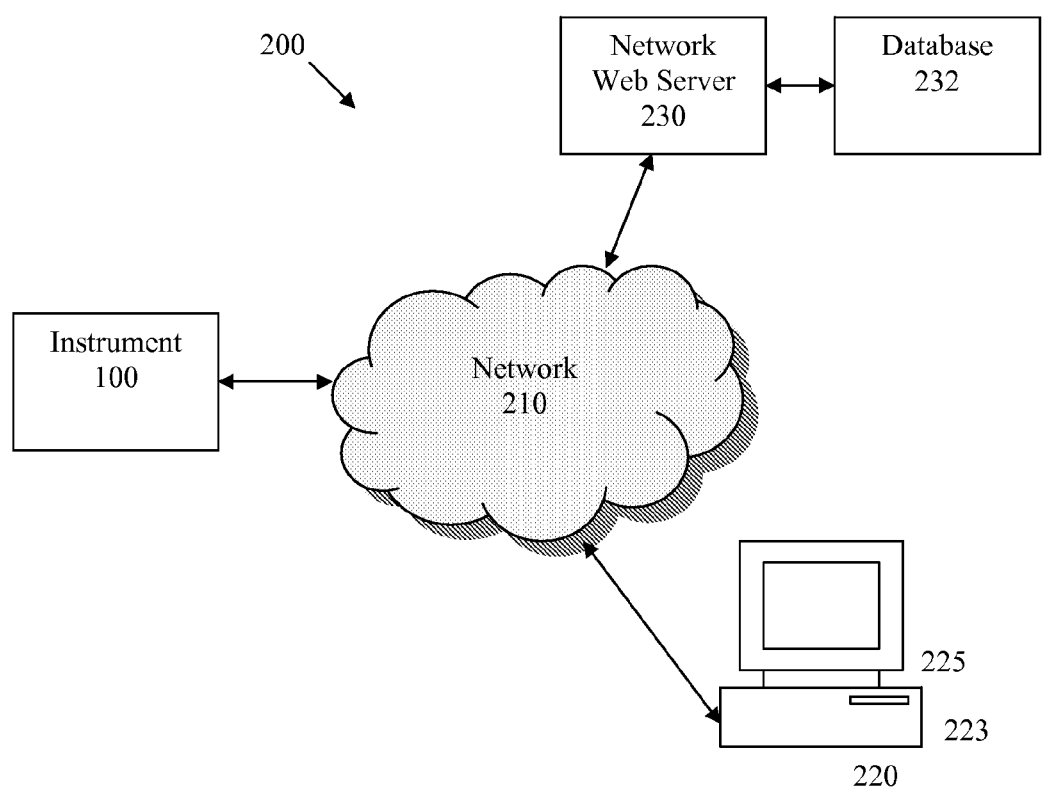
FIG. 2 is a functional block diagram illustrating a system including the electronic instrument of FIG. 1, according to a representative embodiment.

FIG. 2 depicts an exemplary network 200 through which the measurement data 122 and corresponding portable GUI information 124 may be obtained remotely, according to an illustrative embodiment in which the instrument 100 includes web server 140. The network 200 includes the instrument 100 of FIG. 1, client 220, network web server 230 and corresponding database 232, which are connectable through data network 210. The data network 210 may be any network capable of transporting electronic data, such as the Internet, a LAN, a wireless LAN, and the like, and may be a packet switching network, for example. It is understood that the instrument 100, the client 220 and/or the network web server 230 may be connected directly to the data network 210, through corresponding (wired or wireless) modems, T1 lines, or other network/Internet interfaces, or may connect indirectly through corresponding LANs, wireless LANs, or the like.

The client 220 may be implemented by a PC, for example, operating client software 223 and a client GUI 225. For example, the client 220 and the client software 223 may be implemented with an IBM Pentium based PC, using an operating system, such as any compatible Windows operating systems available from Microsoft Corporation, NetWare operating system available from Novell, Inc., or Unix operating system available from Sun Microsystems, Inc. The client software 223 also includes a web browser, such as Microsoft Internet Explorer or Mozilla Firefox, for example. The web browser and imaging software enables display of web pages, e.g., retrieved from the web server 140 via the network 210, on the client 220. The imaging software may include Flash Player, for example, available from Adobe Systems, Inc., and/or may be provided as a browser plug-in. The retrieving and viewing of the web pages may be performed by a typical web browser, without the need for installing dedicated software components.

The network web server 230 includes or is implemented by a processor configured to execute one or more software algorithms, including the portable GUI display process of the embodiments described herein, in conjunction with the database 232. The network web server 230 may include its own memory (e.g., nonvolatile memory) for storing executable software code that allows it to perform the various functions. For example, the network web sever 230 executes web server software, such as Windows Server available from Microsoft Corporation, Apache available from the Apache Software Foundation, or Jigsaw available from World Wide Web Consortium (W3C). Using server software, the network web server 230 is able to communicate with World Wide Web (WWW) clients, such as client 220, and instrument 100, using Hypertext Transfer Protocol (HTTP) messages, HyperText Markup Language (HTML) and/or XML content, for example. The network web server 230 may receive, for example, HTTP messages from the client 220 and provide XML web pages in response. The network web server 230 also includes a network interface for communicating over the data network 210, for example, as described above with respect to network interface 142.

The web browser running on the client 220 is able to retrieve data from the network web server 230 and/or the web server 140 of the instrument 100 asynchronously in the background without interfering with the displayed page. Data is exchanged, for example, with the network web server 230 using XML, although alternative languages may include WBXML, JSON, and the like.

The database 232 may be configured to store various types of information corresponding to the portable GUI information. For example, in an embodiment, the web server 140 uploads the measurement data 122 and corresponding portable GUI information 124 to the database 232 via the data network 210, where it is available to users who may not have the ability or permission to access web server 140 directly. Also, in an embodiment, the database 232 stores updated versions of the portable GUI software, which may be downloaded by the instrument 100 through the web sever 140 for implementation by the processor 125 and/or the web server 140. Alternatively, updated versions of the portable GUI software may be downloaded by the network web server 230, which then implements the portable GUI display process according to the updated version of the portable GUI software, for example, when the instrument 100 has an older version, or when the measurement data 122 is not necessarily accompanied by portable GUI information 124. It is understood that, instead of storing actual data or programming for a particular selection, the database 232 may store a URL or other form of pointer to another storage location. An interactive connection can be maintained among the instrument 100, network web server 230, database 232 and client 220, enabling the user to access and view the measurement data 122 in the appropriate format, as indicated by the portable GUI information 124, in real-time or near real-time, as the measurement takes place.

As stated above, the portable GUI information 124 stored in the memory 120 indicates the display format, according to which corresponding measurement data 122 is to be displayed. In order to remotely retrieve the measurement data 122 and the portable GUI information 124, a user may access the web server 140 from the client 220 over the data network 210, for example, by entering the URL of the web server 140. In response, the web server 140 provides a web page to the client 220, which includes the measurement data 122, along with the portable GUI information 124, for display at the client 220. For example, the web page may include an applet (e.g., the GUI rendering engine 124a) downloadable by the web browser and a software module, such as an object in object oriented programming. The software module may inform the applet of location(s) from which the measurement data 122 and/or portable GUI information 124 may be retrieved (e.g., using URLs). The locations may be different for previously stored data and live (or streaming) data. In an illustrative embodiment, the object may be a Shockwave Flash object, for example, which enables a Flash applet to display the measurement data 122 and portable GUI information 124 at the client 220, using Flash Player.

As a result, the client 220 displays the measurement data 122 in the specified display format. For example, the client 220 may display the measurement data 122 in a format substantially the same as the format in which the measurement data 122 is displayed at the local display 132. The portable GUI information 124 is used, along with the corresponding metadata of the measurement data 122, to structure the display, for example, annotating axes, placing markers, etc. The client 220 is thus able to display the measurement data 122 in a visual manner that would normally be used on local display 132, such as an LCD or CRT display. In various embodiments, this process may be used as a diagnostic tool (e.g., for LAN extensions for instrumentation (LXI) instruments), as well as a remote user interface.

In an embodiment, the network web server 230 provides web pages to the client 220 based on artificially generated or synthetic data, as opposed to data actually collected, e.g., by the instrument 100. This data is displayed according to portable GUI information corresponding to the type of instrument the data is intended to simulate, in substantially the same manner as discussed above.

In alternative embodiments, the web page may incorporate other graphics software capable of accurately simulating the local display 132 on the client 220. For example, the web page may include Asynchronous JavaScript and XML (AJAX), JAVA applications, Silverlight, or the like.

Also, the process of retrieving and displaying the portable GUI information 124 is generic in that the web pages and the web browser of the client 220 do not need to be modified for data from different types of instruments, even though the underlying measurement data and mode of locally displaying the same may differ significantly. Further, a web page may include and the client 220 may display information from multiple instruments 100 at the same time, even when the instruments 100 are different types of devices.

As stated above, a user may retrieve the measurement data 122 and associated portable GUI information 124 from the network web server 230 in substantially the same manner as described above with respect to the instrument web server 140. It is assumed that the measurement data 122 and associated portable GUI information 124 is previously uploaded, for example, to the database 232, in which case the web page provided by the network web server 230 would include information identifying the appropriate storage location.

For example, in order to view measurement data 122 on the network web server 230 using data previously stored, e.g., in the database 232, the network web server 230 also needs to be able to deliver the portable GUI information 124 (e.g., the portable GUI rendering engine 124a and corresponding configuration metadata 124b). This means that, when measurement data 122 is initially provided to the network web server 230 and/or the database 232, the portable GUI information 124 should also be stored as well, if the network web server 230 and/or the database 232 do not already have it. In various embodiments, the portable GUI information 124 only needs to be stored in the network web server 230 and/or the database 232 once per type of instrument, or possibly by product line of the type of instruments having similar local display properties, and thus having the same portable GUI rendering engine 124a and/or configuration metadata 124b.

In various embodiments, the database 232 may include a library of portable GUI information, compatible with various types of measurement instruments (e.g., instrument 100) for remote implementation of the portable GUI display process. For example, a measurement instrument may include a memory and a web server, but not have the processing capacity and/or software for associating portable GUI information 124 with the measurement data. In this case, the measurement data 122 (e.g., the raw data and/or the metadata) may be uploaded to the network web server 230, which selects the appropriate portable GUI information 124 from the software library in database 232 (e.g., based on the type and version of instrument). This remotely provided portable GUI information 124 may then be accessed and displayed by the client 220, using typical web browsing software, in substantially the same manner as described above with respect to the instrument web server 140.

Also, as discussed above, when the version of the portable GUI information 124 is old, the network web server 230 server may be configured to access and use a newer version. The network web server 230 may obtain the newer version of the portable GUI information 124 from variety sources, including from another instrument which includes the newer version or has been more recently updated or manufactured, from the manufacturer's website and/or from the library, which has been previously stored in the database 232 or has been loaded by the manufacturer, as discussed above. Again, the portable GUI information 124 (i.e., the GUI rendering engine 124a and/or the configuration metadata 124b) need only be stored once per unique rendering type.

Further, a user may simply want to store data for later viewing and analysis, in which case the measurement data 122 and associated portable GUI information 124 may be collected over time and stored in the database 232. Subsequently, the user may access the stored information in order to view and analyze the measurement data 122. Also, in an embodiment, the stored measurement data 122 may be interfaced with an electronic laboratory notebook, such as an on-line Wiki Lab Notebook available through OpenWetWare or other interactive program, e.g., running on the client 220, the web server 230 and/or a separate electronic laboratory notebook server (not shown). For example, the measurement data 122 and associated portable GUI information 124 may be inserted directly into a report in the format in which it would appear on the local display 132. This is more efficient and flexible than conventional means, such as inserting bitmap images showing instrument screen shots, for example.

Figure 3:
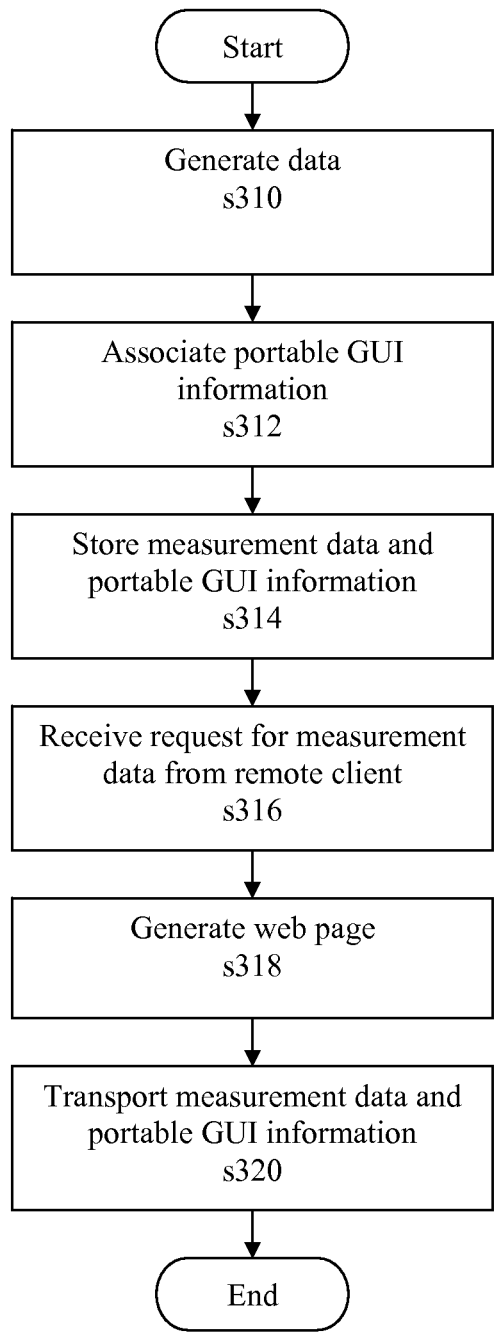
FIG. 3 is a flow diagram of a method for displaying instrument data according to a representative embodiment.

FIG. 3 is a flow diagram showing a process for providing portable GUI displays, according to an embodiment. In step s310, an electronic instrument, such as instrument 100, generates raw data, e.g., from a measurement process specific to the instrument. For example, the instrument 100 may generate data indicating information regarding received signals, voltage levels, or the like. The instrument 100 generates metadata 122b corresponding to the raw data 122a to provide context. The raw data 122a and metadata 122b may be displayed on a local display device 132 of the instrument 100, such as an LCD or CRT display. In step s312, the measurement data 122 is associated with portable GUI information 124, which represents the visual format of the local display device. The measurement data 122 and associated portable GUI information 124 may be stored in relation to each other at step s314, e.g., in memory 120.

In step s316, the instrument 100 receives a request for the measurement data 122, e.g., through web server 140 associated with the instrument 100, from a remote client, e.g., client 220, over data network 210. As stated above, the request may alternatively be SCPI protocol request, for example, from another device in a test system. A web page is generated in step s318 in response to the request, including an applet of the portable GUI information 124, which is downloaded by a web browser operating on the client 220. The web page is populated with the measurement data 122 and associated portable GUI information 124 via an object, which directs the applet to the measurement data 122 and associated portable GUI information 124. The measurement data 122 and associated portable GUI information 124 are transported to the client 220 in step s320. The measurement data 122 may then be displayed within the web page at the remote client 220, using its web browser. The display is formatted the same as the local display device 132 based on the received portable GUI information 124 associated with the measurement data 122.

Figure 4:
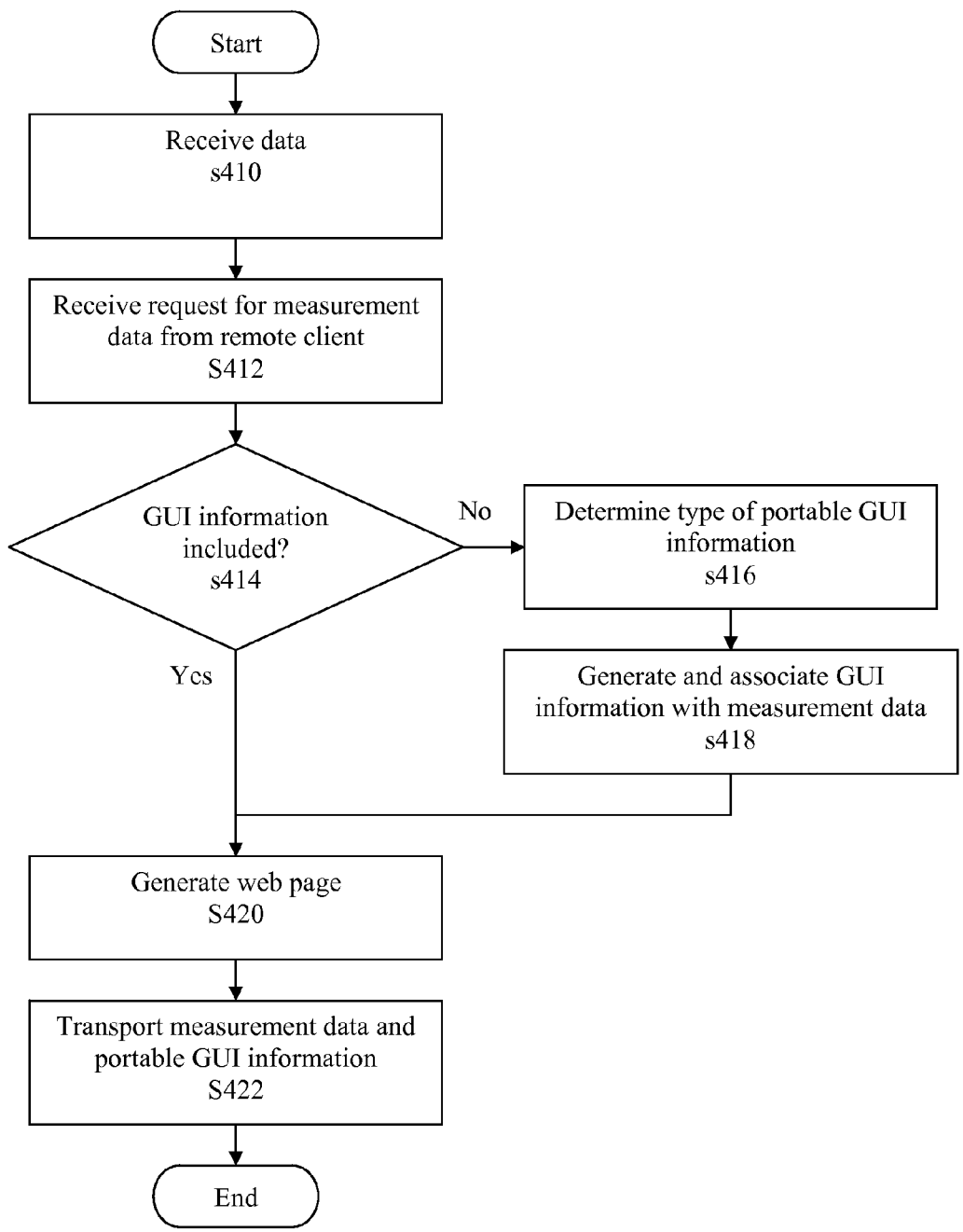
FIG. 4 is a flow diagram of a method for displaying instrument data according to a representative embodiment.

FIG. 4 is a flow diagram showing a process for providing portable GUI displays, according to another embodiment. In step s410, a web server, e.g., network web server 230, receives data, for example, over data network 210. The received data includes at least measurement data, such as measurement data 122, collected and generated by an electronic instrument, such as instrument 100, and may also include corresponding portable GUI information, such as GUI information 124, depending on the capabilities of the instrument. The data may be received (e.g., in real-time or near real-time) from the instrument 100 that has performed the measurement and generated the data, or from a database, such as database 232, that has previously stored the data. The previously stored data may include actual measurement data 122 provided by the measurement instrument or may be computer generated, synthetic measurement data.

In step s412, the web server 230 receives a request for the measurement data 122 from remote client 220 through a data network, such as network 210. In steps s414, it is determined whether the received data includes measurement data 122, as well as related portable GUI information 124, e.g., stored in association with the measurement data 122. When the related portable GUI information 124 is provided (step s414: Yes), the process proceeds to step s420, discussed below. When the related portable GUI information 124 is not provided (step s414: No), the web server 230 determines the appropriate type of portable GUI information 124 in step s416 to be associated with the measurement data 122. For example, the web server 230 may query the instrument 100 or the database 232 to determine the type of instrument 100 that generated the measurement data 122, the type of measurement data 122, a specified format of the measurement data 122 and/or the type of display (e.g., local display 132) on which the measurement data should be appropriately displayed. Alternatively, the received measurement data 122 may include information identifying the type of instrument, format and/or display. In step s418, the web server 230 retrieves the appropriate portable GUI information 124, for example, by accessing a portable GUI library, and associates it with the measurement data 122, which may likewise be stored in the database 232.

A web page is generated in step s420 in response to the request, including an applet which is downloaded by a web browser operating on the client 220. The web page is populated with the measurement data 122 and associated portable GUI information 124 via an object, which directs the applet to the measurement data 122 and associated portable GUI information 124. The measurement data 122 and associated portable GUI information 124 are transported to the client 220 in step s422. The measurement data 122 may then be displayed within the web page at the client 220, using its web browser. The display is formatted the same as the type of local display device of the determined instrument 100, based on the received portable GUI information 124 associated with the measurement data.

While preferred embodiments are disclosed herein, many variations are possible, which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A computer system for displaying of measurement data, the computer system comprising:
    a data storage to store measurement data generated by a plurality of different test instruments, wherein each test instrument is a device that is connectable to a device under test (DUT) to receive signals from the DUT and measure parameters of the received signals to determine at least a portion of the measurement data, wherein each test instrument has a type of portable graphical user interface (GUI) information for displaying the measurement data generated by the test instrument, and wherein the types of the portable GUI information are different for different types of the test instruments;
    a processor to:
        receive a request for stored measurement data generated by a test instrument of the plurality of different test instruments;
        query the test instrument to determine a type of the test instrument that generated the measurement data and a type of the requested measurement data;
        determine the type of the portable GUI information of the test instrument for displaying the measurement data based on the determined type of test instrument and the type of the measurement data; and
        generate portable GUI information according to the determined type of the portable GUI information and to associate the portable GUI information with the requested measurement data, wherein the portable GUI information comprises a GUI rendering engine and corresponding metadata for configuring the GUI rendering engine for displaying the requested measurement data in accordance with the determined type of the portable GUI information,
        wherein the corresponding metadata comprising customized display features corresponding to display parameters associated with the determined type of the portable GUI information; and
    a transport interface to deliver the measurement data and the associated portable GUI information to a remote display, wherein the remote display is operable to display the measurement data in accordance with the determined type of the portable GUI information.

2. The computer system of claim 1, wherein the transport interface comprises a network interface configured to transport the measurement data and the associated portable GUI information over a data network to the remote display.

3. The computer system of claim 2, wherein the network interface comprises a web computer system configured to populate a web page with the measurement data and the associated portable GUI information in response to a request from a web client over a data network, and to transport the populated web page to the web client over the data network, the web client comprising the remote display.

4. The computer system of claim 3, wherein the web page comprises an applet to be downloaded by a web browser of the web client, the applet identifying the measurement data and the associated GUI information to enable the web client to display the measurement data according to the type of the portable GUI information.

5. The computer system of claim 4, wherein a location of the measurement data and the associated GUI information is provided by a self-contained software module.

6. The computer system of claim 5, wherein the self-contained software module comprises one of a Shockwave Flash object, a Silverlight object or a Java applet.

7. The computer system of claim 4, wherein the applet enables the web client to display the measurement data substantially in real-time.

8. The computer system of claim 3, wherein the web computer system includes an electronic laboratory notebook utilizing the measurement data and the associated GUI information.

9. The computer system of claim 3, wherein the web page further comprises other graphics software capable of accurately simulating a local display of the test instrument within the web page.

10. The computer system of claim 3, wherein the web page displays measurement data and associated portable GUI information from multiple ones of the test instruments of different types at the same time.

11. The computer system of claim 2, wherein the network interface comprises a standard commands for programmable instrumentation (SCPI) interface.

12. The computer system of claim 1, wherein the transport interface comprises a universal serial bus (USB) interface configured to transport the measurement data and the associated portable GUI information to a portable USB storage device compatible with the remote.

13. The computer system of claim 1, wherein the type of the portable GUI information is associated with a local display of the test instrument.

14. The computer system of claim 13, wherein the local display comprises one of a liquid crystal display (LCD) or a cathode ray tube (CRT) display.

15. The computer system of claim 1, wherein the corresponding metadata comprises a uniform resource locator.

16. The computer system of claim 1, wherein the metadata of the portable GUI information provides additional information to facilitate proper understanding and interpretation of the measurement data and the metadata comprises at least one of:
    an acquisition rate of the test instrument,
    a vertical axis calibration of the test instrument,
    a horizontal axis calibration of the test instrument,
    a marker placement of the test instrument,
    value ranges of the test instrument,
    time stamps of the measurement data,
    a trace form of the test instrument,
    a histogram form of the test instrument,
    a pie-chart form of the test instrument,
    a center point of the measurement data,
    a scale of the measurement data, and
    a scale mark spacing of the measurement data.

17. The computer system of claim 1, further comprising a database including a library of portable GUI information, each portable GUI information in the library associated with one or more types of the test instruments;
    wherein the processor configured to generate the portable GUI information is configured to select the appropriate portable GUI information from the library of the portable GUI information based on a type of the test instrument.

18. The computer system of claim 17, wherein each portable GUI information associated with multiple types of the test instruments in the library is so associated on a basis that the multiple types of the test instruments comprise at least one of the same product lines, the same display properties, the same portable GUI rendering engines and the same configuration metadata.

19. The computer system of claim 1, wherein the test instrument comprises at least one of an oscilloscope, a spectrum analyzer, a network analyzer, a chemical analyzer, and a voltmeter.

20. A method of remotely displaying data, the method comprising:
- storing, by a processor, measurement data measured by a plurality of different test instruments, wherein each test instrument of the plurality of different test instruments is a device that is connectable to a device under test (DUT) to receive signals from the DUT and measure parameters of the received signals to determine at least a portion of the measurement data, wherein each test instrument has a type of a portable GUI information for displaying the measurement data measured by the test instrument, and wherein the types of the portable GUI information are different for different types of the test instruments;
- receiving, by the processor, a request for stored measurement data generated by a test instrument of the plurality of different test instruments;
- querying, by the processor, the test instrument to determine a type of the test instrument that generated the measurement data and a type of the measurement data;
- determining, by the processor, the type of the portable GUI information of the test instrument for displaying the measurement data based on the determined type of test instrument and the type of the measurement data;
- generating, by the processor, portable graphical user interface (GUI) information according to the determined type of the portable GUI information;
- providing metadata for the portable GUI information, the metadata comprising customized display features corresponding to display parameters associated with the type of the portable GUI information, wherein the metadata includes at least one of:
  - an acquisition rate of the test instrument,
  - a vertical axis calibration of the test instrument,
  - a horizontal axis calibration of the test instrument,
  - a marker placement of the test instrument,
  - value ranges of the test instrument,
  - time stamps of the measurement data,
  - a trace form of the test instrument,
  - a histogram form of the test instrument,
  - a pie-chart form of the test instrument,
  - a center point of the measurement data,
  - a scale of the measurement data, and
  - a scale mark spacing of the measurement data;
- populating a web page with the measurement data and the GUI information; and
- transporting the populated web page to a web client over a data network for display, wherein the web client is operable to display the measurement data in accordance with the type of the portable GUI information.

* * * * *